United States Patent [19]

Moore et al.

[11] Patent Number: 4,504,904
[45] Date of Patent: Mar. 12, 1985

[54] BINARY LOGIC STRUCTURE EMPLOYING PROGRAMMABLE LOGIC ARRAYS AND USEFUL IN MICROWORD GENERATION APPARATUS

[75] Inventors: Victor S. Moore, Pompano Beach; Joel C. Leininger, Boca Raton, both of Fla.

[73] Assignee: International Business Machines Corporation, Armonk, N.Y.

[21] Appl. No.: 388,556

[22] Filed: Jun. 15, 1982

[51] Int. Cl.³ .............................................. G06F 1/00
[52] U.S. Cl. .................................. 364/200; 307/465; 340/825.83; 364/716
[58] Field of Search ............... 364/716, 200 MS File, 364/900 MS File; 340/825.83, 825.84, 825.85, 825.86, 825.87; 307/465

[56] References Cited

U.S. PATENT DOCUMENTS

| | | | |
|---|---|---|---|
| 3,287,286 | 10/1976 | Muehldorf | 235/152 |
| 3,987,287 | 10/1976 | Cox et al. | 307/465 X |
| 4,034,356 | 7/1977 | Howley et al. | 340/173 R |
| 4,207,556 | 6/1980 | Sugiyama et al. | 340/166 R |

OTHER PUBLICATIONS

C. Barre, "La Famille des FPLA", Electronique et Applications Industrielles, Apr. 1978, pp. 21-25.
M. S. Schmookler, "Two-Level Programmed Logic Array Adder", IBM Technical Disclosure Bulletin, Apr. 1979, pp. 4313-4316.
P. W. Cook et al., "A Study in the Use of PLA-Based Macros", IEEE Journal of Solid-State Circuits, Oct. 1979, pp. 833-840.

*Primary Examiner*—Raulfe B. Zache
*Attorney, Agent, or Firm*—Richard E. Bee

[57] ABSTRACT

Binary logic structure is described which requires less space on an integrated circuit chip. This structure includes an encode programmable logic array responsive to a first group of binary input signals for producing a smaller number of binary signals which are encoded to identify different binary value combinations for the first group of binary input signals. This structure further includes a decode programmable logic array responsive to a second group of binary input signals and to the encoded binary signals produced by the encode programmable logic array for producing binary output signals representing logical functions of binary input signals in both the first and second groups. The chip space occupied by the encode programmable logic array is less than the additional chip space that would be required if the encode and decode programmable logic arrays were replaced by a single programmable logic array for receiving all the binary input signals in both the first and second groups. When used to provide microword generation apparatus for a microprogrammed digital system, the encode programmable logic array is responsive to a plural-bit system instruction for producing a plural-bit instruction identification signal uniquely representative of such system instruction but having a smaller number of bits than the system instruction. In such case, the decode programmable logic array is responsive to the instruction identification signal and to number signals produced by a sequence counter for producing a sequence of microwords needed to execute the system instruction.

13 Claims, 7 Drawing Figures

BINARY LOGIC STRUCTURE EMPLOYING PROGRAMMABLE LOGIC ARRAYS AND USEFUL IN MICROWORD GENERATION APPARATUS

CROSS-REFERENCE TO RELATED APPLICATIONS

The present patent application is related to the following copending U.S. patent applications:

(1) Application Ser. No. 350,660, filed Feb. 22, 1982, entitled "Microword Control System Utilizing Multiplexed Programmable Logic Arrays", the inventors being Victor S. Moore et al;

(2) Application Ser. No. 350,662, filed Feb. 22, 1982, entitled "Microword Control System Utilizing A Programmable Logic Array And A Sequence Counter", the inventors being Joel C. Leininger et al;

(3) Application Ser. No. 350,663, filed Feb. 22, 1982, entitled "Microword Generation Mechanism Utilizing Separate Programmable Logic Arrays For First And Second Microwords", the inventors being Joseph C. Rhodes, Jr. et al;

(4) Application Ser. No. 334,185 filed Dec. 24, 1981, entitled "Large Scale Integration Data Processor Signal Transfer Mechanism", the inventors being Virgil D. Wyatt et al;

(5) Application Ser. No. 350,683, filed Feb. 22, 1982, entitled "Clocking Mechanism For Multiple Overlapped Dynamic Programmable Logic Arrays Used In A Digital Control Unit", the inventors being Gerard A. Veneski et al;

(6) Application Ser. No. 350,682, filed Feb. 22, 1982, entitled "Microcode Control Mechanism Utilizing Programmable Microcode Repeat Counter", the inventors being Tony E. Parker et al; and (7) Application Ser. No. 350,681, filed Feb. 22, 1982, entitled "Integrated Circuit Mechanism For Coupling Multiple Programmable Logic Arrays To A Common Bus", the inventors being Wayne R. Kraft et al.

The descriptions set forth in these copending applications are hereby incorporated in the present application by this reference thereto.

TECHNICAL FIELD

This invention relates to binary logic structures formed on large scale integration (LSI) semiconductor integrated circuit chips of the type used in digital computers, digital data processing systems, digital control systems and the like. This invention is particularly useful in the microword generation portion of microprogrammed data processors and other microprogrammed digital systems.

BACKGROUND ART

Programmable logic arrays (PLA's) are useful mechanisms for implementing complex binary logic functions on semiconductor integrated circuit chips. They provide a regular and orderly structure for implementing irregular and complex combinational logic functions. They are more flexible and are easier to design than are other types of logic structures. A typical programmable logic array (PLA) and some of its uses are described at pages 79-88 of a textbook entitled *Introduction to VLSI Systems*, by Mead and Conway, published by Addison-Wesley Publishing Company, Reading, Mass. 1980.

Space is invariably a matter of considerable importance on an integrated circuit chip. The usual objective is to maximize the number of circuits and circuit structures that can be located on a single chip. In spite of their various advantages, programmable logic arrays sometimes require more space on a chip than is desired.

SUMMARY OF THE INVENTION

This invention provides a new and improved binary logic structure which uses programmable logic arrays (PLA's) in such a way that the structure as a whole requires less space on an integrated circuit chip. This logic structure is comprised of a plurality of programmable logic arrays which are coupled in cascade with one another with the output of a first of the PLA's providing part of the input to a second of the PLA's. The first PLA is relatively small in size and the chip space occupied by it is less than the additional chip space that would be required if both the first and second PLA's were replaced by a single PLA of sufficient size to accommodate all of the input signals.

The first PLA in such a cascaded PLA combination is referred to herein as an "encode" PLA. It is responsive to a first group of the binary input signals for producing an encoded group of output signals having a smaller number of bits than in the input group. This encoded group of signals is used to provide part of the input for the second PLA which is referred to herein as a "decode" PLA. Because of the smaller number of bits in the encoded group, less chip space is required for the second PLA than would otherwise be the case. In particular, the reduction in chip space required for the second PLA is greater than the chip space occupied by the first or encode PLA. Thus, the two PLA's in cascade require less chip space than would an equivalent single PLA.

For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

Referring to the drawings.

Figure 1:
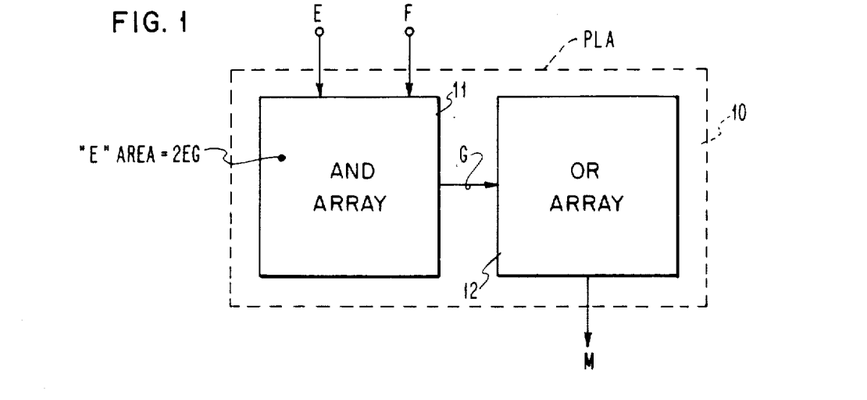
FIG. 1 is a functional block diagram showing the major elements of a single programmable logic array.

DESCRIPTION OF FIG. 1 BINARY LOGIC STRUCTURE

FIG. 1 shows binary logic structure which is fabricated or formed on a semiconductor integrated circuit chip and which is comprised of a single programmable logic array (PLA) 10. This PLA 10 includes an input AND array 11, an output OR array 12 and a goodly number of product lines or word lines individually connecting the different outputs of the AND array 11 to the corresponding inputs of the OR array 12. For simplicity of illustration, these multiple word lines are represented by a single multiline bus G.

A first group of binary input signals are supplied to a first set of inputs of the AND array 11 by way of a first multiline input bus E. A second group of binary input signals are supplied to a second set of inputs of the AND array 11 by way of a second multiline input bus F. Multiple binary output signals are produced by the OR array 12 and appear on the multiline output bus M. These output signals on the output bus M represent various logical functions of the input signals on the input buses E and F.

Included in the internal construction of the AND array 11 are two sets of signal lines which cross each other at right angles to form a rectangular grid pattern. One set is the internal input signal lines which are driven by the signals appearing on the input buses E and F. For the example described herein, so-called "single-bit partitioning" is assumed. Thus, the AND array 11 includes two internal input signals lines for each signal line in the input buses E and F. One such internal input line carries the true value of the input signal and the other such internal input line carries the complement value of the input signal. To this end, the AND array 11 includes an input bit partitioner which receives the input signals on the buses E and F and provides the true and complement values of such signals to the internal input signal lines in the AND array 11.

The other set of internal signal lines in the AND array 11 are the so-called "word" lines G. These cross the internal input lines at right angles thereto. These input lines and word lines are formed at different levels on the integrated circuit chip so that they are not in electrical contact with one another. The logic functions provided by the AND array 11 are determined by the locations and connections of transistors which are formed on the integrated circuit chip for purposes of coupling each word line to one or more of the internal input signal lines. These transistors are located and connected so that the resultant signal on each word line represents a desired logical function of one or more of the input signals on the input buses E and F.

The OR array 12 is also comprised of two sets of signal lines which cross each other at right angles to form a rectangular grid pattern. The input set of such signal lines are the word lines G and the output set of such signal lines are the OR array output lines M. The word lines G within the OR array 12 cross the output lines M at a different level on the chip so that there is no direct electrical contact therebetween. The OR'ing functions provided by the OR array 12 are determined by the locations and connections of transistors which are formed on the integrated circuit chip for coupling various ones of the word lines G to various ones of the output lines M.

For the case of single-bit partitioning, which is the case assumed herein, the signal on each of the word lines G can be thought of as being the AND function of some combination of the true and complement values of one or more of the input signals appearing on the input buses E and F. In a similar vein, the output signals appearing on each of the OR array output lines M can be thought of as being the OR function of the signals appearing on one or more of the word lines G. In the actual physical layout on the integrated circuit chip, the AND array 11 abuts the OR array 12 with no wasted space between the arrays. The separation shown in the drawing is for convenience of explanation only.

Typical examples of the internal construction of the AND array and the OR array are given in the above-cited textbook by Mead and Conway.

The relative physical size, that is, the relative amount of chip space occuppied by the AND array 11 is a function of the total number of input lines (buses E and F) and the total number of word lines (bus G). To a reasonable first-order approximation, the relative chip space or area for the AND array 11 is proportional to $2(E+F)G$, where E, F and G represent the numbers of lines in the buses E, F and G, respectively. The factor of "2" is included because, for single bit partitioning, the AND array 11 has two internal input signal lines for each line in each of the buses E and F. The relative chip space or area required for the input lines in the bus E is proportional to $2EG$. The relative size of the OR array 12 is proportional to $GM$, where M denotes the number of lines in the output bus M.

Figure 2:
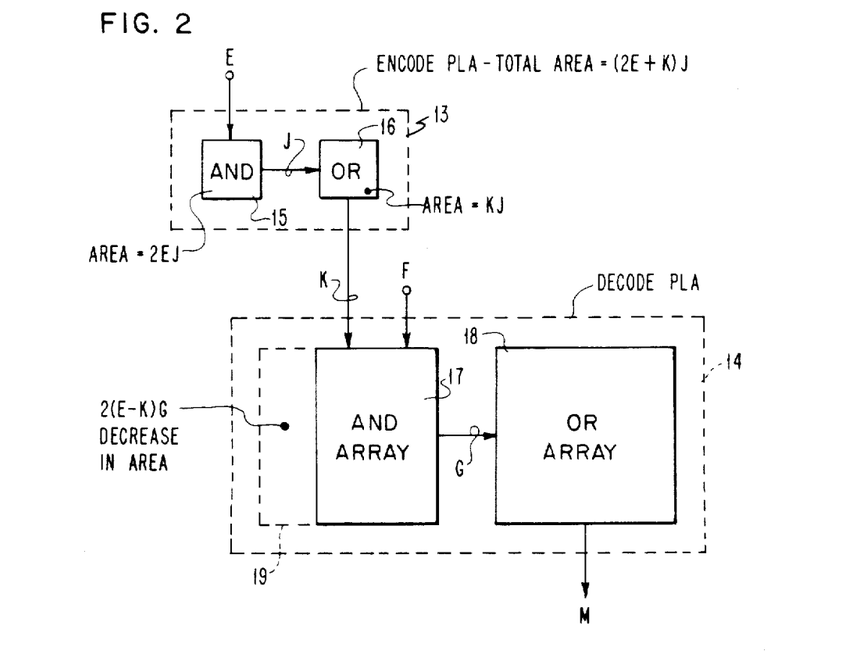
FIG. 2 is a functional block diagram showing the major elements of two programmable logic arrays coupled in cascade.

DESCRIPTION OF FIG. 2 BINARY LOGIC STRUCTURE

Referring to FIG. 2, there is shown an embodiment of binary logic structure constructed in accordance with the present invention. It includes a first PLA 13 coupled in cascade with a second PLA 14. As will be seen, this will, under the proper conditions, result in the use of less space on the integrated circuit chip, as compared to the logic structure of FIG. 1. Both of the PLA's 13 and 14 are formed on one and the same integrated circuit chip. For sake of a name, the first PLA 13 will be referred to herein as an "encode" PLA and the second PLA 14 will be referred to as a "decode" PLA. Each of these PLA's 13 and 14 has the same general form of internal construction as was described above for the PLA 10 of FIG. 1.

The encode PLA 13 includes an input AND array 15, an output OR array 16 and a plurality of word lines located in a multiline bus J for connecting the outputs of the AND array 15 to the corresponding inputs of the OR array 16. In a similar manner, the decode PLA 14 includes an input AND array 17, an output OR array 18 and a plurality of word lines located in a multiline bus G for connecting the outputs of the AND array 17 to the corresponding inputs of the OR array 18. Single-bit partitioning is assumed for each of the AND arrays 15 and 17. Each of the AND arrays 15 and 17 is of the same general form of internal construction as was described for the case of the AND array 11 of FIG. 1. In a similar vein, each of the OR arrays 16 and 18 has the same general form of internal construction as was described above for the OR array 12 of FIG. 1. For sake of comparison, the numbers of signal lines in the buses E, F, G and M of FIG. 2 are assumed to be the same as the numbers of signal lines in the buses E, F, G and M, respectively, of FIG. 1.

The encode PLA 13 is responsive to a first group of binary input signals E for producing a smaller number of binary signals K which are encoded to identify different binary value combinations for the first group of binary input signals E. The decode programmable logic array 14 is responsive to a second group of binary input signals F and to the encoded binary signals K produced by the encode PLA 13 for producing binary output signals M representing logical functions of binary input signals in both the first and second groups E and F.

The use of the encode PLA 13 to more tightly encode the binary input signals E reduces the number of signal lines K running to the input of the AND array 17 in the second PLA 14, this reduction being represented by the factor (E−K), where E and K represent the numbers of signal lines in the buses E and K, respectively. This, in turn, reduces the amount of chip space required for the AND array 17. This reduction or decrease in area is proportional to 2(E−K)G. This reduction in area is represented by the broken line boundary 19. This reduction, however, does not represent the net saving of chip space. The use of the encode PLA 13 requires some chip space. The relative chip space occuppied by the encode PLA 13 is proportional to (2E+K)J. In order to obtain a net saving in chip space, this space required for the encode PLA 13 must be less than the decrease in space realized for the decode AND array 17. In a goodly number of applications, this condition can be satisfied.

The net percent saving in chip area can be described to a reasonable first order approximation by the following mathematical equation:

$$\text{Percent Saving} = \frac{2(E-K)G - (2E+K)J}{2EG}$$

The denominator term 2EG represents the FIG. 1 case where only a single PLA is employed and all of the binary input signals E are supplied to its AND array 11. This 2EG factor represents the area required in the AND array 11 for the input signals E.

Figure 3:
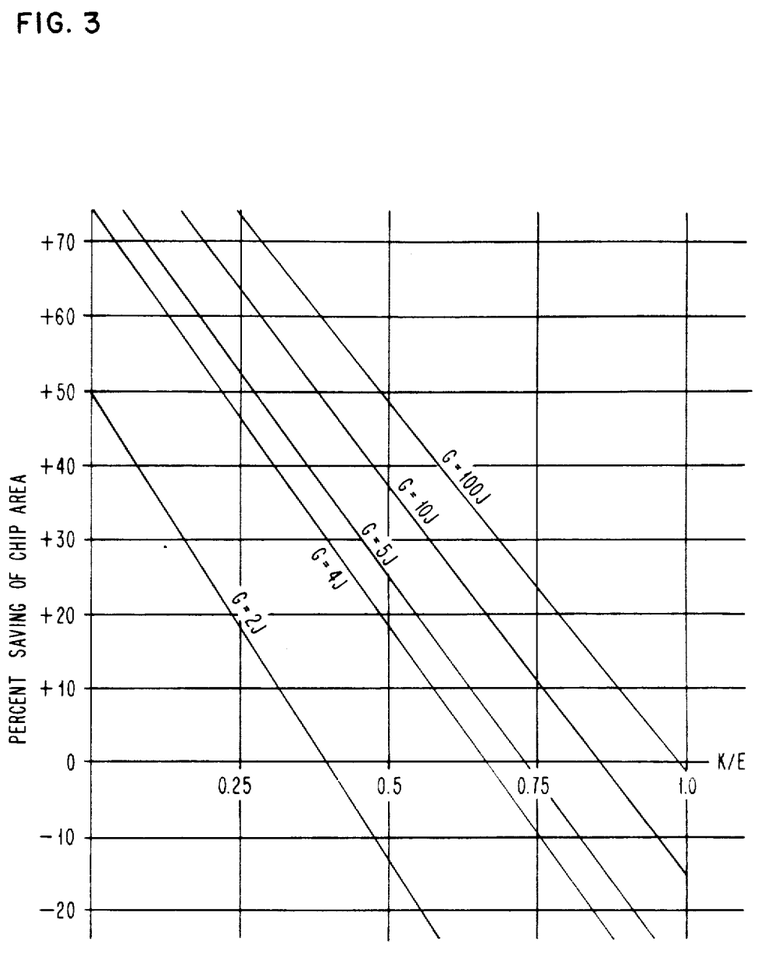
FIG. 3 is a graph used in explaining the construction of the FIG. 2 programmable logic arrays.

FIG. 3 is a graph showing the percent saving of chip space for different values of the ratio K/E. Various lines are plotted for different values of the ratio G/J. These lines were plotted using the above-given percent saving equation.

As seen from the graph of FIG. 3, a greater percentage saving is realized when the number of word lines G in the decode PLA 14 is much larger than the number of word lines J in the encode PLA 13. For example, for the case where the bus K has half as many signal lines as the bus E (K/E=0.5), there is a net saving of approximately 18.5 percent when the decode AND array 17 has four times as many word lines G as there are word lines J in the encode PLA 13. For this same K/E value, the percent saving increases to approximately 37.5 percent when the number of word lines G in the decode PLA 14 is ten times larger than the number of word lines J in the encode PLA 13.

To obtain a net saving of chip space, the encode PLA 13 should be relatively small compared to the decode PLA 14. The primary aspect in meeting this criteria is that the number of word lines J in the encode PLA 13 must be substantially smaller than the number of word lines G in the decode PLA 14. The relative numbers of word lines in the two PLA's is determined by the natures of the two groups of binary input signals E and F. In particular, the signals in group F should be tightly encoded and each code value should be used with a high degree of frequency in determining the resultant output signals produced by the decode OR array 18. By tightly encoded is meant that practically every binary value combination for the signals in group F are used. For example, if group F has five signals (5 bits), this can provide 32 different binary code values or combinations. To be tightly encoded, substantially all 32 such binary code values should be used.

The signals in group E, on the other hand, should be loosely encoded and should be used less often in determining the resultant output from the decode OR array 18. By loosely encoded is meant that many of the different possible binary code values for the group E signals are not used. Assume, for example, that there are 16 signals (16 bits) in group E and that only some 200 out of the total possible 65,536 different binary code values are used. In this case, the input signals in group E are said to be loosely encoded. In such a case, the encode PLA 13 acts to tighten up the encoding by producing a different unique encoded identification signal only for those 200 code combinations which are actually used. In this manner, the number of input signal lines for group E can be reduced from 16 to 8. In other words, the input bus K for the decode PLA will have only 8 signal lines, as opposed to the original 16 signal lines in the input bus E.

One practical type of situation where the present invention can sometimes be used to advantage is the case of control systems using so-called finite-state machines which are implemented by means of a PLA. In such machines, the state signals which are fed back from the output of the OR array to the input of the AND array are normally fairly tightly encoded and are used quite often in determining the resultant output. The data signals, on the other hand, which are supplied to the input of the AND array for purposes of guiding the operation of the PLA, are sometimes rather loosely encoded. In such a case, a separate relatively small encode PLA can be used to good advantage to reduce the number of data input lines for the larger main PLA.

Another type of application wherein the present invention may be used to good advantage is represented by the case of microprogrammed digital data processors. The present invention can be used in the control unit of a digital data processor to provide an improved microword generation mechanism.

Figure 4:
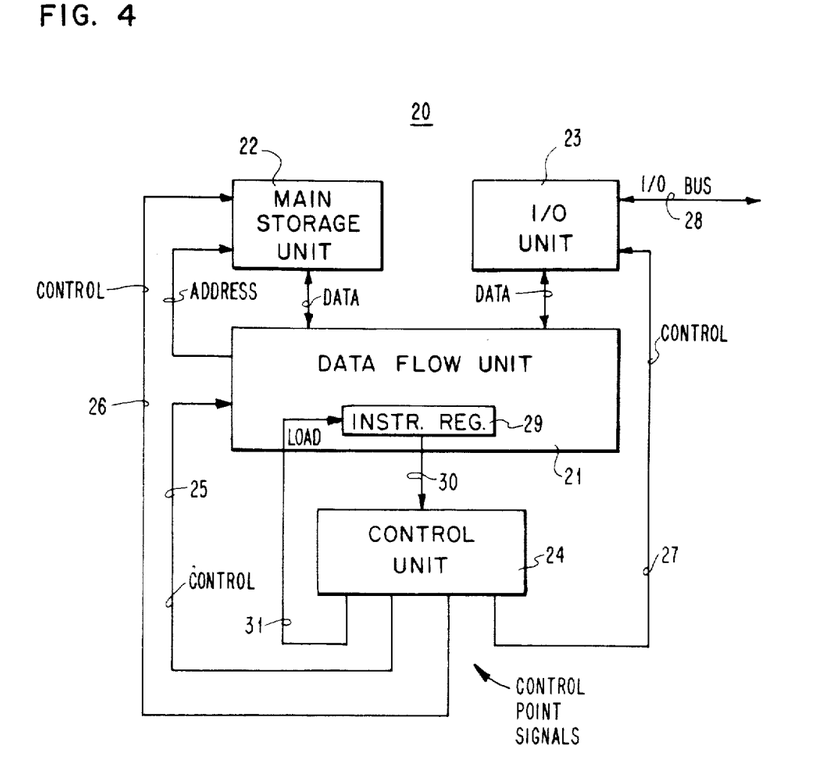
FIG. 4 is a functional block diagram of a digital data processor wherein the binary logic structure of the present invention may be used to good advantage.

DESCRIPTION OF FIG. 4 DATA PROCESSOR

Referring to FIG. 4, there is shown a functional block diagram of a digital system wherein the binary logic structure of the present invention may be used to good advantage. The digital system of FIG. 4 is a microprogrammed data processor 20 wherein a sequence of microwords are used to control the execution of each system or processor instruction. This data processor 20 includes a data flow unit 21, a main storage unit 22, an input/output (I/O) unit 23 and a control unit 24. The data flow unit 21 is sometimes called a central processing unit (CPU) and includes such things as an arithmetic and logic unit (ALU), various hardware registers and counters, a local storage unit, and a bus system interconnecting these items with one another. The data flow unit 21 is the unit that does the adding, subtracting, rearranging and other manipulation of the data to produce the desired results.

The control unit 24 controls the operation of the data flow unit 21, the main storage unit 22 and the I/O unit 23 by means of various control point signals which are supplied by way of respective multiline control buses 25, 26 and 27 to the various functional elements located in these units 21, 22 and 23. Control unit 24 includes microword generation apparatus for producing a sequence of microwords for each system instruction, in this case, processor instruction, to be executed. These microwords, in turn, produce the control point signals which control the elemental operations in the other data processor units.

The user program to be performed by the data processor 20 is initially loaded into the main storage unit 22 from one of the peripheral units (not shown) coupled to the I/O unit 23 by way of an I/O bus 28. This initial loading is accomplished by way of the data flow unit 21. After such initial loading, the user program is performed by reading from the main storage unit 22 in a sequential manner the various processor instructions which make up the user program. Each processor instruction, in its turn, is read out of the main storage unit 22 and loaded into an instruction register 29 located in the data flow unit 21. The processor instruction resident in the instruction register 29, or at least the effective operation code portion thereof, is supplied to the control unit 24 by way of a multiline bus 30 to identify to the control unit 24 the particular processor instruction to be executed.

Loading of a new processor instruction into the instruction register 29 is accomplished by way of a control point signal which is supplied by way of a control line 31 to a load control terminal of the instruction register 29.

The data flow unit 21, the I/O unit 23 and the control unit 24 can all be fabricated on one and the same integrated circuit chip. In order to accomplish this, the circuit structures formed on the chip must be designed to minimize their usage of chip space.

Figure 5:
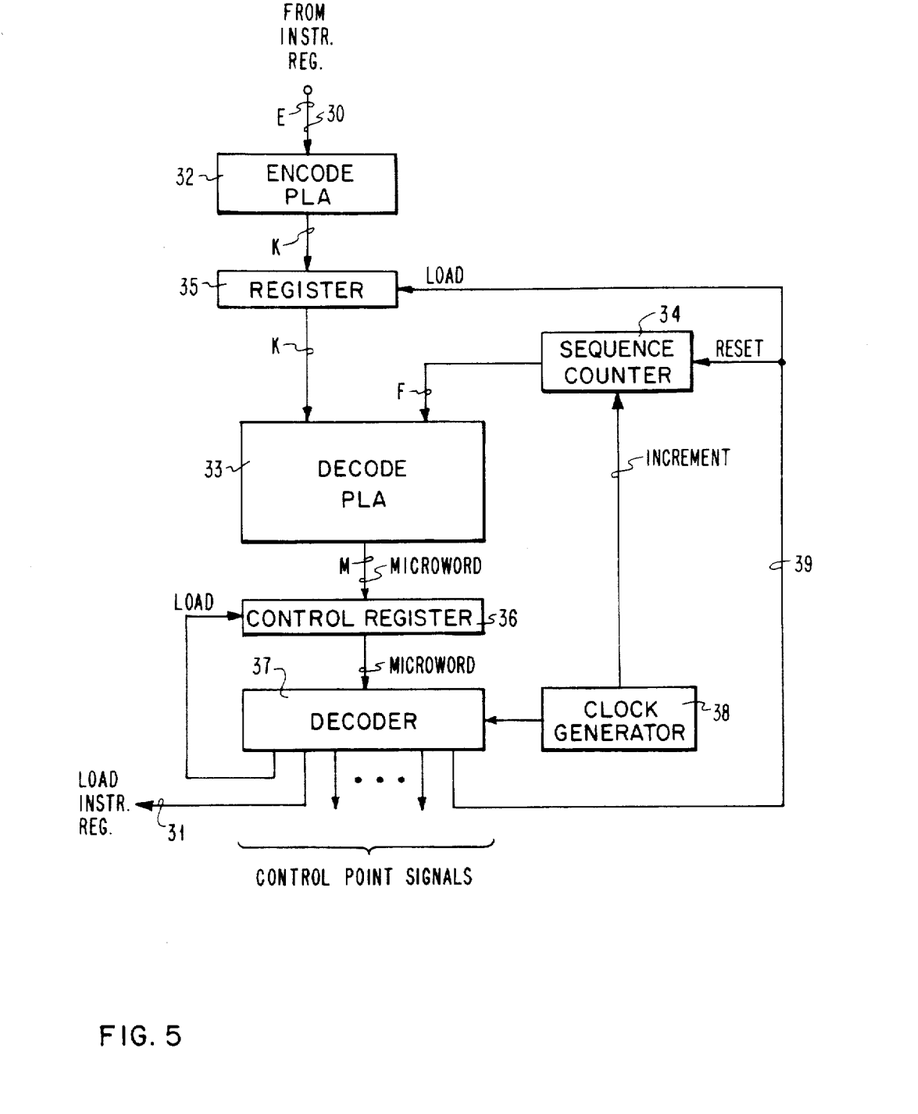
FIG. 5 is a functional block diagram of a first embodiment of microword generation apparatus which is constructed in accordance with the present invention and which may be used to provide the control unit of FIG. 4.

DESCRIPTION OF FIG. 5 CONTROL UNIT

Referring to FIG. 5, there is shown in greater detail a representative form of construction for the control unit 24 of FIG. 4. This construction includes a first embodiment of microword generation apparatus constructed in accordance with the present invention. This improved microword generation apparatus includes an encode PLA 32, a decode PLA 33 and sequence counter circuitry 34. For simplicity of explanation, each of the PLA's 32 and 33 is assumed to be a "static" PLA, as opposed to a "dynamic" or clocked PLA. In making this assumption, it is to be understood that the present invention is also applicable to the case of dynamic PLA's.

The encode PLA 32 is responsive to a plural-bit system instruction to be executed for producing a plural-bit instruction identification signal uniquely representative of such system instruction but having a smaller number of bits than the system instruction. In the present embodiment, the system instruction is the processor instruction which is being supplied to the input of the encode PLA 32 from the instruction register 29 by way of the multibit or multiline bus 30. The instruction identification signal produced by the encode PLA 32 is supplied by way of a multi-stage binary register 35 to a first set of inputs of the AND array in the decode PLA 33.

The processor instruction supplied to the encode PLA 32 may be, for example, a 16-bit binary word. The particular data processor being considered may have, for example, 200 different processor instructions in its instruction repertoire. In this case, the input bus E would be a 16-line bus, the output bus K would be an 8-line bus and the register 35 would be an 8-bit binary register for receiving the 8-bit instruction identification signal produced by the encode PLA 32.

The sequence counter 34 is a plural-bit binary counter for supplying plural-bit binary number signals to a second set of inputs of the AND array in the decode PLA 33. The sequence counter 34 may be, for example, a 6-bit counter for supplying in a parallel manner a 6-bit number by way of the input bus F to the decode PLA 33. In this case, the bus F is a 6-line bus.

The decode PLA 33 is responsive to the instruction identification signal from the encode PLA 32 and to the number signals from the sequence counter 34 for producing a sequence of microwords for each processor instruction to be executed. The microwords appear one at a time at the output of the OR array in the decode PLA 33. Each microword may have a width of, for example, 60 bits. In this case, the output bus M is a 60-line bus.

The control unit embodiment of FIG. 5 further includes control circuitry responsive one at a time to the microwords from the decode PLA 33 for producing for each microword a plurality of control point signals for controlling for one microword cycle the operation of the digital data processing system of FIG. 4. This control circuitry includes a multibit control register 36, a decoder 37 and a clock pulse generator 38. The number of bit positions or stages in the control register 36 is the same as the number of bit positions in a single microword. The microword appearing at the output of the decode PLA 33 is loaded into the control register 36 at the end of the preceding microword cycle. The microword residing in control register 36 drives the decoder 37 to cause the decoder 37 to produce the particular control point signals for that particular microword.

In general, each microword will include several encoded plural-bit control fields. Decoder 37 decodes the encoded fields to produce the appropriate individual control point signals. Any non-encoded or bit-significant bits in the microword will be supplied straight through by the decoder 37. The clock generator 38 supplies the clock pulses which determine the points in time at which the control point signals actually appear at the output of the decoder 37. In some data processors, there is one clock pulse per microword cycle, while in other data processors there are a group of time spaced clock pulses for each microword cycle. Decoder 37 will typically have a relatively large number of control point output lines. In a typical data processor, there may be a hundred or more such output lines. For any given microword, only a relatively small number of these control point lines will be activated to produce the desired control actions for that particular microword.

The clock generator 38 also supplies clock pulses to the increment input terminal of the sequence counter 34 for increasing the count in the sequence counter 34 by a value of one count for each microword cycle. The timing is such that immediately after a particular microword is loaded into the control register 36, the sequence counter 34 is incremented by one to enable the decode PLA 33 to commence producing the next microword. The repeated incrementing of the sequence counter 34 causes the decode PLA 33 to produce a sequence of microwords for any given instruction identification signal residing in the register 35. The last microword in the sequence will, among other things, cause the control point line 39 to be activated to load the next instruction identification signal into the register 35 and to reset the sequence counter 34 to a zero count condition.

With reference to FIG. 4, for each new processor instruction loaded into the instruction register 29, a new instruction identification signal is produced by the encode PLA 32 and, at the appropriate point in time, is loaded into the register 35. The loading of the new processor instruction into the instruction register 29 is done at some appropriate point during the occurrence of the microword sequence for the processor instruction currently being executed. In other words, some of the microwords being produced for the currently executing processor instruction also cause activation of the appropriate control point signal lines for fetching the next processor instruction from the main storage unit 22 and loading it into the instruction register 29. The encode PLA 32 then operates to produce the appropriate instruction identification signal for this next processor instruction. The last microword for the currently executing instruction is effective to load this next instruction identification signal into the encode PLA output register 35 and to reset the sequence counter 34 to commence the generation of the microword sequence for this next processor instruction.

For the previously given example of a 16-bit processor instruction (input E) and a processor instruction repertoire of 200 instructions, the encode PLA 32 has 200 word lines and its encoded output K has a width of 8 bits. For this same case, the decode PLA 33 may have, for example, on the order of 1000 word lines. This makes G (number of decode PLA word lines) equal to 5 times J (the number of encode PLA word lines). Since the ratio K/E is equal to 0.5, this gives a percent saving of chip space of approximately 25% as seen from the graph of FIG. 3. Thus, for this example, the use of the encode PLA 32 in cascade with the decode PLA 33 provides a 25% savings of chip space as compared to the case where the encode PLA 32 is omitted and the processor instruction is supplied without modification to the decode PLA 33. In that case, the decode PLA 33 would need to have a much wider input AND array to accommodate the increased number of input bits.

A rule of thumb for PLA's is that the larger the PLA becomes in size, the slower is its response time (the time required to produce a valid output following a change in the input). A decode PLA 33 having 1000 word lines would begin to show the effect of this rule. In particular, it would have a slower response time than may be desirable for some applications. The next embodiment to be described herein (FIG. 6) shows a way of reducing this slower response time effect. In particular, this is accomplished by replacing the larger decode PLA 33 by a plurality of smaller decode PLA's which are operated in an overlapped time-multiplexed manner.

All of the hardware units and elements shown in FIG. 5 are preferably formed on a single integrated circuit chip.

Figures 6, 6A:
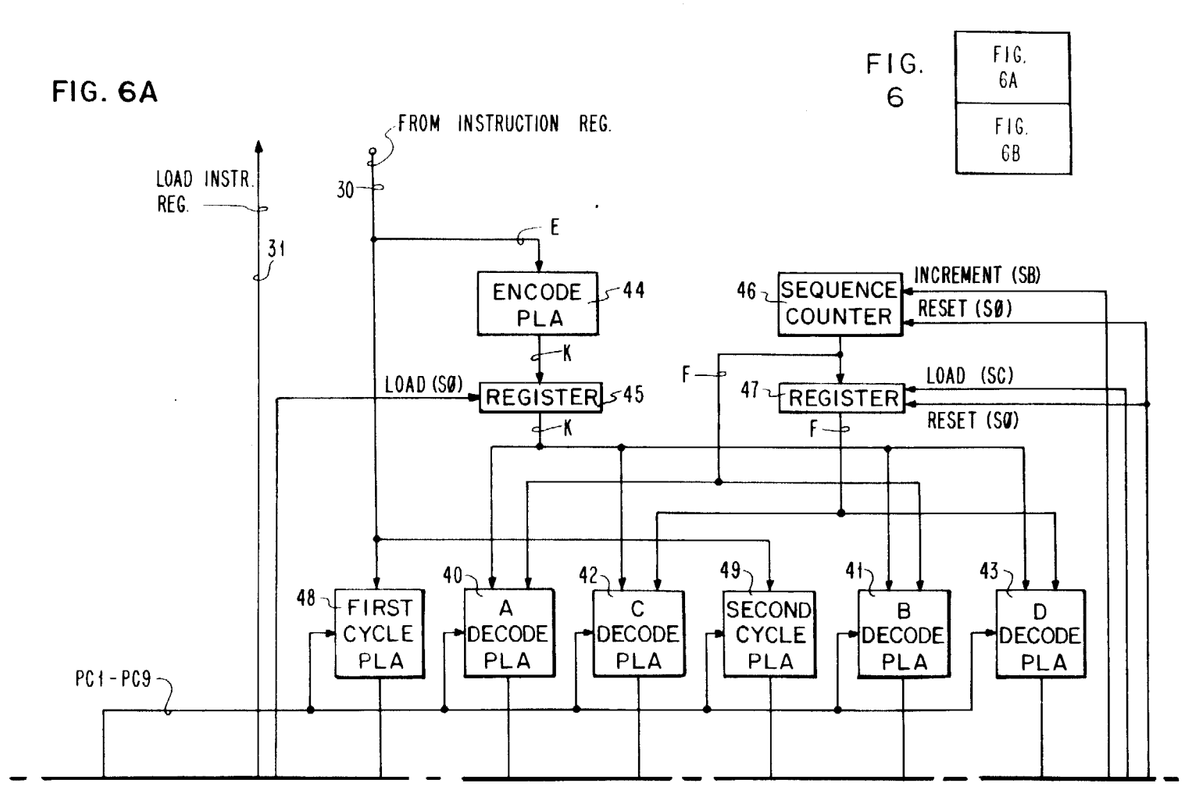
FIG. 6 which is comprised of FIGS. 6A and 6B, is a functional block diagram of a second embodiment of microword generation apparatus which is constructed in accordance with the present invention and which may instead be used to provide the control unit of FIG. 4.

DESCRIPTION OF FIG. 6 CONTROL UNIT

Figure 6B:
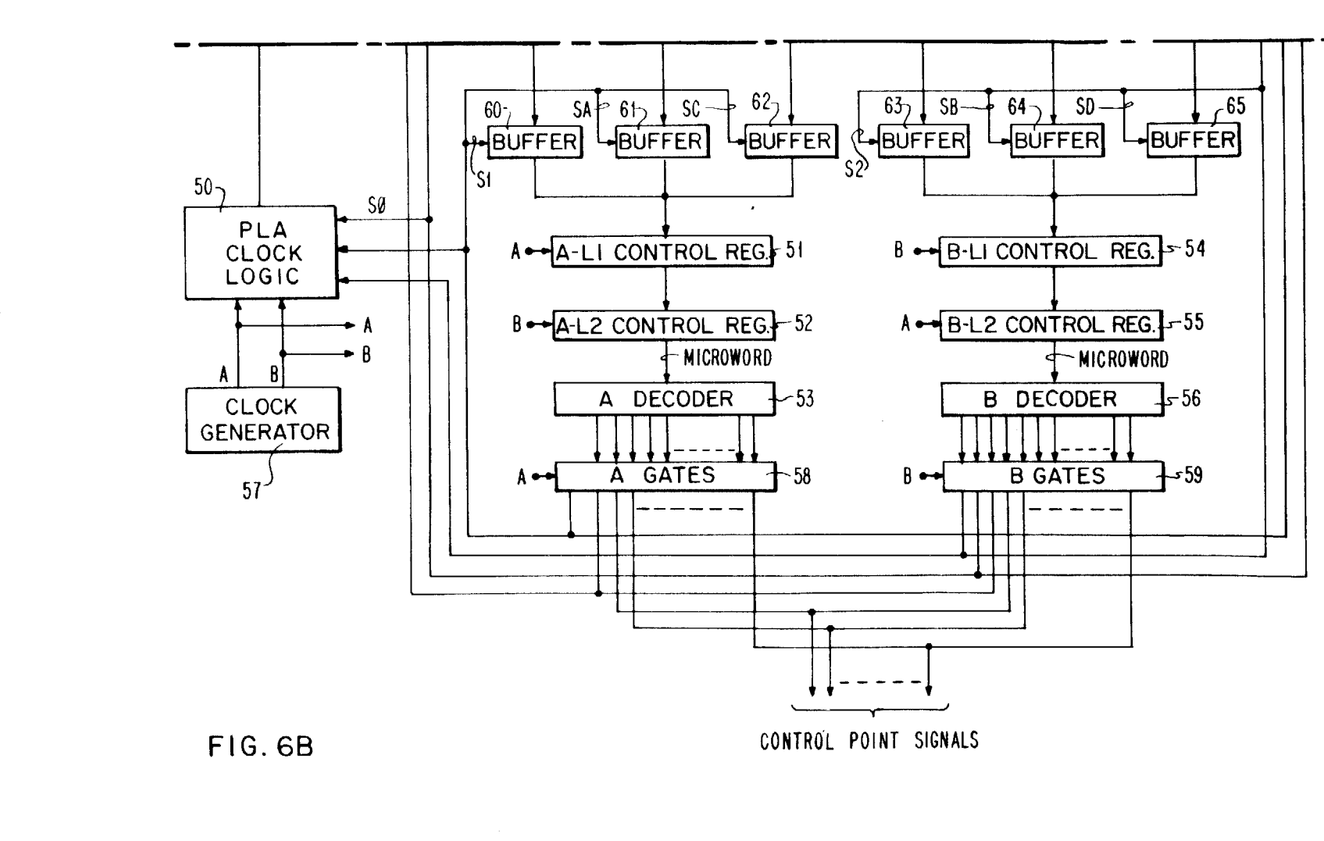

Referring to FIGS. 6A and 6B taken together (in the manner indicated in FIG. 6), there is shown a functional block diagram of a second embodiment of microword generation apparatus which is constructed in accordance with the present invention and which may be used to provide the control unit 24 of FIG. 4. This control unit embodiment of FIG. 6 is described in considerable detail in the above-referenced related application Ser. No. 350,660 of Victor S. Moore et al and entitled "Microword Control System Utilizing Multiplexed Programmable Logic Arrays". For this reason, only a summary description of the FIG. 6 embodiment will be given herein. Reference can be made to the copending application for further details.

Relative to the FIG. 5 embodiment, the FIG. 6 embodiment employs a decode PLA mechanism which is comprised of four smaller decode PLA's 40,41,42 and 43 which are operated in an overlapped parallel manner. The decode PLA's 40-43 are labeled as the A, B, C and D decode PLA's, respectively. These different decode PLA's 40-43 produce different ones of the microwords needed to execute a given processor instruction. In particular, the microwords from the different decode PLA's 40-43 are used in a repeating A-B-C-D sequence.

The decode PLA's 40-43 are driven in a parallel manner by an encode PLA 44 and a register 45. These correspond respectively to the encode PLA 32 and the register 35 of FIG. 5. The encode PLA 44 produces a plural-bit instruction identification signal on bus K having a smaller number of bits than the processor instruction on bus E.

The second inputs of the decode PLA's 40-43 are driven by the plural-bit number signals which are produced by a sequence counter 46 which corresponds to the sequence counter 34 of FIG. 5. The sequence count numbers for the last two decode PLA's 42 and 43 are supplied by way of a register 47. This is done to adjust the timing to take into account the overlapped operation of the different decode PLA's.

The FIG. 6 embodiment includes two additional PLA's, namely, a first cycle PLA 48 and a second cycle PLA 49. The first cycle PLA 48 produces the first and only the first microword needed in the execution of a given processor instruction. The second cycle PLA 49 produces the second and only the second microword needed for such processor instruction. The decode PLA's 40-43 provide the remainder of the microwords needed to execute the instruction. Thus, the microword sequence for any given processor instruction is 1-2-A-B-C-D-A-B-C-D . . . , where 1 and 2 denote the microwords produced by the first and second cycle PLA's 48 and 49, respectively. These first and second cycle PLA's 48 and 49 are relatively small fast-acting PLA's which are driven directly by the processor instruction in the instruction register 29. This enables the first two microwords to be produced very quickly. This allows more time for the other PLA's to commence producing the remainder of the microwords for a given processor instruction.

In the present embodiment, the decode PLA's 40-43 and the first and second cycle PLA's 48 and 49 are dynamic or clocked PLA's. As such, each uses a set of four time-spaced non-overlapping clocking pulses C1,C2,C3 and C4 to produce each valid output bit pattern. The C1-C2-C3-C4 clock pulse sets for the successive ones of the PLA's 48,49,40,41,42 and 43 are offset relative to one another by one microword cycle so that the C1 pulse for the second PLA 49 coincides with the C2 pulse for the first PLA 48, the C1 pulse for the third PLA 40 coincides with the C2 pulse for the second PLA 49, etc. Thus, the internal operations for the PLA's 48,49,40,41,42 and 43 are offset but overlapped in time. These C1-C4 PLA internal clocking pulses are obtained from PLA clock logic 50.

The encode PLA 44 may also be a dynamic PLA but for simplicity of explanation herein, is assumed to be a static PLA.

In the FIG. 6 embodiment, two sets of control registers and decoders are employed. An "A" set is represented by control registers 51 and 52 and a decoder 53. A "B" set is represented by control registers 54 and 55 and a decoder 56.

The control unit of FIG. 6 is driven by a two-phase nonoverlapping clock generator 57. It produces two sets of interleaved but nonoverlapping clock pulses, one set being Set A and the other being Set B. Among other things, the A clock pulses periodically enable a set of A gates 58 and the B clock pulses periodically enable a set of B gates 59, such enablings being in an interleaved but non-overlapping manner. In this manner, the A decoder 53 and the B decoder 56 are caused to provide the control point signals in an alternating A-B-A-B manner. Many of the control point lines from the A decoder 53 are OR'ed with their counterparts from the B decoder 56 so that many of the units in the FIG. 4 data processor can receive their control point signals during either the A or the B clock phase.

The first cycle PLA 48 and the A and C decode PLA's 40 and 42 supply their microwords one at a time to the A control register 51. Each microword, in turn, is passed to the second A control register 52 to drive the A decoder 53 to produce the output control point signals which are passed by the A gates 58 during the A clock phases. In a similar but time interleaved manner, the second cycle PLA 49, the B decode PLA 41 and the D decode PLA 43 supply their microwords one at a time to the first B control register 54, from whence they are transferred to the second B control register 55 to drive the B decoder 56 to produce the control point signals which are passed by the B gates 59 during the B clock phases.

Among other things, each microword produces a control point signal which is referred to herein as a PLA output strobe signal. This strobe signal selects the PLA which is to supply the next microword to its associated control register. The PLA strobes from the A decoder 53 select between the PLA's 48, 40 and 42 to obtain the next microword for the A control register 51. The first cycle PLA 48 is selected to provide only the first microword needed for any given processor instruction. Thereafter, the microwords for the A control register 51 are alternately taken from the A and C decode PLA's 40 and 42. The PLA output strobes from the A decoder 53 are identified as S1, SA and SC and are individually supplied to the respective ones of PLA output buffers 60, 61 and 62. Each of these buffers 60-62 is comprised of a set of parallel gating circuits or gates which are simultaneously activated or enabled by its particular PLA output strobe. When enabled, the buffer supplies the microword appearing at the output of its associated PLA to the input of the A control register 51.

In a corresponding manner, the PLA output strobes S2, SB and SD produced by the B decoder 56 are used to select between the PLA's 49, 41 and 43 to obtain the next microword for the B control register 54. These PLA strobes S2, SB and SD are individually supplied to the respective ones of the PLA output buffers 63, 64 and 65. The S2 strobe line for the second cycle PLA 49 is activated only to provide the microword for the second microword cycle for any given processor instruction. After that, the remaining microwords for the B control register 54 are obtained in an alternating manner from the B and D decode PLA's 41 and 43.

The results of the foregoing multiplexing of the various microwords is to provide for each processor instruction a sequence of microwords obtained from the various PLA's 40-43, 48 and 49 in the following order: 1,2,A,B,C,D,A,B,C,D,A,B, ... The numbers and letters identify the source PLA's. The first and second cycle PLA's 48 and 49 provide only the first and second microwords. The remainder of the microwords for any given processor instruction are taken from the A, B, C and D decode PLA's in a sequential A-B-C-D manner, the exact number of additional microwords being whatever is needed to complete the execution of that particular processor instruction.

The encode PLA output register 45 is loaded and the sequence counter 46 and its associated register 47 are reset to zero by a control point signal pulse $S\phi$ obtained from the B decoder 56. This $S\phi$ pulse is produced by the microword which is the third from the end of the microword sequence for the processor instruction currently being executed. The sequence counter 46 is incremented once for each set of A,B,C and D microwords by the PLA output strobe pulse SB. The counter buffer register 47 is reloaded once for each set of A,B,C and D microwords by the PLA output strobe pulse SC.

The PLA clock logic 50 is driven by the $S\phi$ control point signal, the various PLA output strobes S1,S2,SA,SB,SC and SD and the A and B clock pulses from the clock generator 57. These various pulses contain the necessary and sufficient information to produce the different sets of C1–C4 internal clocking pulses required by the different ones of the PLA's 40–43, 48 and 49.

All of the circuitry for the control unit of FIG. 6 is preferably formed on a single integrated circuit chip. The use of the encode PLA 44 to drive the four decode PLA's 40–43 results in a saving of chip space for the reasons previously mentioned. In calculating the amount of space saved, the four decode PLA's 40–43 are equivalent to a single decode PLA having a number of word lines which is equal to the sum of the numbers of word lines in the individual decode PLA's 40–43. Where multiple decode PLA's are used, some further saving of space is realized because of the reduced number of signal lines K which are required to run to the inputs of all of the various different decode PLA's.

While there have been described what are at present considered to be preferred embodiments of this invention, it will be obvious to those skilled in the art that various changes and modifications may be made therein without departing from the invention, and it is, therefore, intended to cover all such changes and modifications as fall within the true spirit and scope of the invention.

What is claimed is:

1. Binary logic structure requiring less space on an integrated circuit chip and comprising:
    an encode programmable logic array responsive to a first group of binary input signals for producing a smaller number of binary signals which are encoded to identify different binary value combinations for the first group of binary input signals;
    a decode programmable logic array responsive to a second group of binary input signals and to the encoded binary signals produced by the encode programmable logic array for producing binary output signals representing logical functions of binary input signals in both the first and second groups;

the encode and decode programmable logic arrays being formed on a single integrated circuit chip;

and the chip space occupied by the encode programmable logic array being less than the additional chip space that would be required if the encode and decode programmable logic arrays were replaced by a single programmable logic array for receiving all the binary input signals in both the first and second groups.

2. Binary logic structure requiring less space on an integrated circuit chip and comprising:

an encode programmable logic array responsive to a first group of binary input signals for producing a smaller number of binary signals which are encoded to identify different binary value combinations for the first group of binary input signals;

a decode programmable logic array responsive to a second group of binary input signals and to the encoded binary signals produced by the encode programmable logic array for producing binary output signals representing logical functions of binary input signals in both the first and second groups;

the encode programmable logic array including an input AND array responsive to the first group of binary input signals, an output OR array for producing the encoded binary signals and a plurality of word lines connecting the outputs of the AND array to the inputs of the OR array;

and the decode programmable logic array including an input AND array responsive to the second group of binary input signals and to the encoded binary signals produced by the encode programmable logic array, an output OR array for producing the binary output signals and a plurality of word lines connecting the outputs of the AND array to the inputs of the OR array.

3. Binary logic structure in accordance with claim 2 wherein the number of word lines in the decode programmable logic array is much larger than the number of word lines in the encode programmable logic array.

4. Binary logic structure in accordance with claim 2 wherein the number of word lines in the decode programmable logic array is at least twice as large as the number of word lines in the encode programmable logic array.

5. Binary logic structure in accordance with claim 2 wherein:

the first group of binary input signals is supplied to the input AND array of the encode programmable logic array by a first group of signal paths;

the encoded binary signals are supplied from the output OR array of the encode programmable logic array to the input AND array of the decode programmable logic array by a second group of signal paths;

and the number of signal paths in the second group is smaller than the number of signal paths in the first group.

6. In a microprogrammed digital system wherein a sequence of microwords are used to control the execution of each system instruction, improved microword generation apparatus comprising:

an encode programmable logic array responsive to a plural-bit system instruction to be executed for producing a plural-bit instruction identification signal uniquely representative of such system instruction but having a smaller number of bits than the system instruction;

sequence counter circuitry for supplying plural-bit number signals;

and a decode programmable logic array mechanism responsive to the instruction identification signal and to the number signals for producing a sequence of microwords needed to execute the system instruction.

7. Improved microword generation apparatus in accordance with claim 6 wherein:

the encode programmable logic array, the sequence counter circuitry and the decode programmable logic array mechanism are formed on a single integrated circuit chip;

and the chip space occuppied by the encode programmable logic array is less than the additional chip space that would be required for the decode programmable logic array mechanism if the encode programmable logic array were omitted and the system instruction were supplied without modification to the decode programmable logic array mechanism.

8. Improved microword generation apparatus in accordance with claim 6 wherein:

the encode programmable logic array includes an input AND array responsive to the system instruction, an output OR array for producing the instruction identification signal and a plurality of word lines connecting the outputs of the AND array to the inputs of the OR array;

and the decode programmable logic array mechanism includes an input AND array responsive to both the instruction identification signal and the number signals, an output OR array for producing microwords and a plurality of word lines connecting the outputs of the AND array to the inputs of the OR array.

9. Improved microword generation apparatus in accordance with claim 8 wherein the number of word lines in the decode programmable logic array mechanism is much larger than the number of word lines in the encode programmable logic array.

10. Improved microword generation apparatus in accordance with claim 6 and further including register circuitry for supplying the instruction identification signal from the encode programmable logic array to the decode programmable logic array mechanism.

11. Improved microword generation apparatus in accordance with claim 10 and further including:

control circuitry responsive to the microwords from the decode programmable logic array mechanism for producing control point signals for controlling the operation of the digital system;

and circuitry for supplying a predetermined control point signal to the register circuitry for loading same with a new instruction identification signal and to the sequence counter circuitry for resetting same.

12. Improved microword generation apparatus in accordance with claim 6 wherein the decode programmable logic array mechanism includes a plurality of programmable logic arrays each responsive to the instruction identification signal and to the number signals for producing different ones of the microwords needed to execute the system instruction.

13. Improved microword generation apparatus in accordance with claim 12 and further including:
   control circuitry for controlling the operation of the digital system;
   and multiplexing circuitry for supplying microwords from different ones of the decode programmable logic arrays to the control circuitry during different time intervals.

* * * * *